United States Patent
Chuang et al.

(10) Patent No.: US 9,613,670 B2
(45) Date of Patent: Apr. 4, 2017

(54) MEMORY SYSTEMS AND METHODS INVOLVING HIGH SPEED LOCAL ADDRESS CIRCUITRY

(71) Applicant: GSI TECHNOLOGY, INC., Sunnyvale, CA (US)

(72) Inventors: Patrick Chuang, Cupertino, CA (US); Mu-Hsiang Huang, San Jose, CA (US); Lee-Lean Shu, Los Altos, CA (US)

(73) Assignee: GSI Technology, Inc., Sunnyvale, CA (US)

(*) Notice: Subject to any disclaimer, the term of this patent is extended or adjusted under 35 U.S.C. 154(b) by 0 days.

(21) Appl. No.: 15/068,075

(22) Filed: Mar. 11, 2016

(65) Prior Publication Data

US 2016/0196858 A1 Jul. 7, 2016

Related U.S. Application Data

(63) Continuation of application No. 14/207,350, filed on Mar. 12, 2014, now Pat. No. 9,318,174.

(60) Provisional application No. 61/799,781, filed on Mar. 15, 2013.

(51) Int. Cl.
| | | |
|---|---|---|
| G11C 7/00 | (2006.01) | |
| G11C 8/10 | (2006.01) | |
| G11C 8/08 | (2006.01) | |
| G11C 7/10 | (2006.01) | |
| G11C 16/08 | (2006.01) | |
| G11C 8/06 | (2006.01) | |

(52) U.S. Cl.
CPC ............. *G11C 8/10* (2013.01); *G11C 7/1078* (2013.01); *G11C 7/1084* (2013.01); *G11C 8/06* (2013.01); *G11C 8/08* (2013.01); *G11C 16/08* (2013.01)

(58) Field of Classification Search
CPC .................................................... G11C 7/1078
USPC ...................................................... 365/189.05
See application file for complete search history.

(56) References Cited

U.S. PATENT DOCUMENTS

| | | |
|---|---|---|
| 4,794,561 A | 12/1988 | Hsu |
| 5,624,863 A | 4/1997 | Helm et al. |
| 5,994,178 A | 11/1999 | Wu |
| 6,001,674 A | 12/1999 | Wu |
| 6,117,754 A | 9/2000 | Wu |
| 6,127,706 A | 10/2000 | Wu |
| 6,417,549 B1 | 7/2002 | Oh |
| 6,693,842 B2 * | 2/2004 | Chung .............. G11C 7/1051 365/194 |
| 6,894,356 B2 | 5/2005 | Choi |
| 7,910,427 B1 | 3/2011 | Ikeda et al. |
| 2006/0077002 A1 | 4/2006 | White |

(Continued)

*Primary Examiner* — Son Mai
(74) *Attorney, Agent, or Firm* — DLA Piper LLP (US); Nicholas Panno (57) ABSTRACT

Systems and methods of memory and memory operation are disclosed, such as providing a circuit including a local address driver voltage source for memory decoding. In one exemplary implementation, an illustrative circuit may comprise a first buffer and a capacitor. The first buffer may comprise a power input and a ground input. The capacitor may comprise a first terminal connected to the power input of the first buffer and a second terminal connected to the ground input of the first buffer. When the first buffer draws a current from the power input, at least a portion of the current may be supplied by the capacitor.

27 Claims, 6 Drawing Sheets

(56) References Cited

U.S. PATENT DOCUMENTS

2007/0287239 A1    12/2007   Yoon et al.
2013/0257175 A1*   10/2013   Yoshida ................ G11O 5/147
                                                            307/109

* cited by examiner

MEMORY SYSTEMS AND METHODS INVOLVING HIGH SPEED LOCAL ADDRESS CIRCUITRY

CROSS-REFERENCE TO RELATED APPLICATION INFORMATION

This application is a continuation of U.S. non-provisional application Ser. No. 14/207,350 filed Mar. 12, 2014, which claims priority to provisional application No. 61/799,781, filed Mar. 15, 2013. The entirety of all the above-listed applications are incorporated herein by reference.

APPENDIX

An appendix entitled "Appendix A" is attached hereto and incorporated by reference in its entirety.

BACKGROUND

Field

Innovations herein relate generally to memory and/or memory addressing and, more specifically, to systems and methods of memory and memory operation such as providing a local address driver voltage source for memory decoding.

Description of Related Information

High speed memory circuits may operate within tight tolerances. Multiple operations, such as read and/or write operations, may be performed within a single gigahertz-level clock cycle by a memory circuit with a one volt-level operating voltage. Operations which cause excessive voltage drain on the circuit, even in a narrow time interval, may severely reduce overall memory speed. Accordingly, preventing and/or reducing such voltage drains may result in memory circuits with high performance characteristics.

BRIEF DESCRIPTION OF THE DRAWINGS

The accompanying drawings, which constitute a part of this specification, illustrate various implementations and features of the present inventions and, together with the description, help explain aspects of the innovations herein. In the drawings.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

Aspects of the innovations herein relate generally to memory and/or memory addressing, such as systems and methods providing a local address voltage source and/or a local complimentary address voltage source for high performance memory decoding operations.

Figure 1:
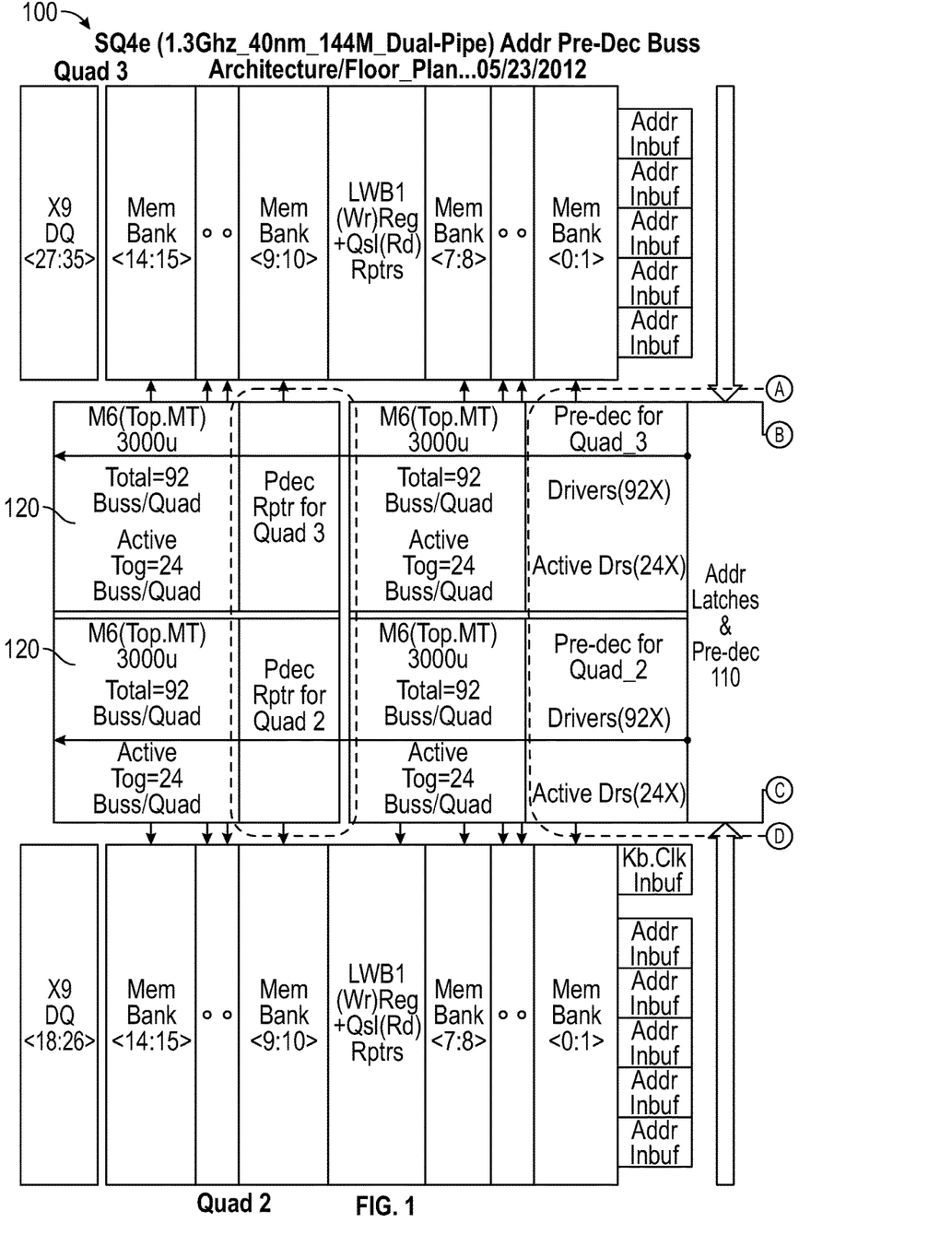
FIG. 1 shows a memory architecture consistent with certain aspects related to the innovations herein.

FIG. 1 shows a memory circuit 100 architecture consistent with certain aspects related to the innovations herein. This memory circuit 100 is provided as an example of a memory circuit which may employ local address voltage sources and/or local complimentary address voltage sources, although other memory circuit types and other memory circuit architectures may also include such features. This example memory circuit 100 may be divided into 4 quadrants (QUAD 0-QUAD 4), and the quadrants may in turn be divided into eight groups of two memory banks for sixteen total memory banks per quadrant. Each quadrant may also be associated with nine data lines (DQs).

All of the quadrants may be in communication with a central pre-decoder 110 into which all inbound memory addressing data may be fed from circuits external to the memory circuit 100. Four lines 120 may lead from the pre-decoder 110, one to each quadrant. In some cases the lines 120 may extend all the way from the pre-decoder 110 to the memory banks of each quadrant farthest from the pre-decoder 110. In other cases, one or more repeaters (pdec rptr) may be provided on each line 120 to boost the signal from the pre-decoder 110 to one or more of the memory banks along the line 120, as shown in this example. With one line 120 per quadrant, this example memory circuit 100 may have 92 drivers associated with each line, and 24 of those 92 drivers may be simultaneously active on any of the lines at any time. In sum, there may be as many as 96 total active busses at any time.

Even in circuits manufactured to very high tolerances, there may always be some resistance in any signal path, such as the four lines 120 of the memory circuit 100. Likewise, there may be resistance in any Vdd and/or Vss signal path used in the memory circuit 100, such as a Vdd line used to drive memory buffers, as described below. Furthermore, circuitry between a point of data input and a memory bank may add additional resistance. For example, the pre-decoder 110 may add some resistance to the memory circuit 100. As will be explained in greater detail below, resistance in some paths may impact memory circuit 100 performance.

Figure 2A:
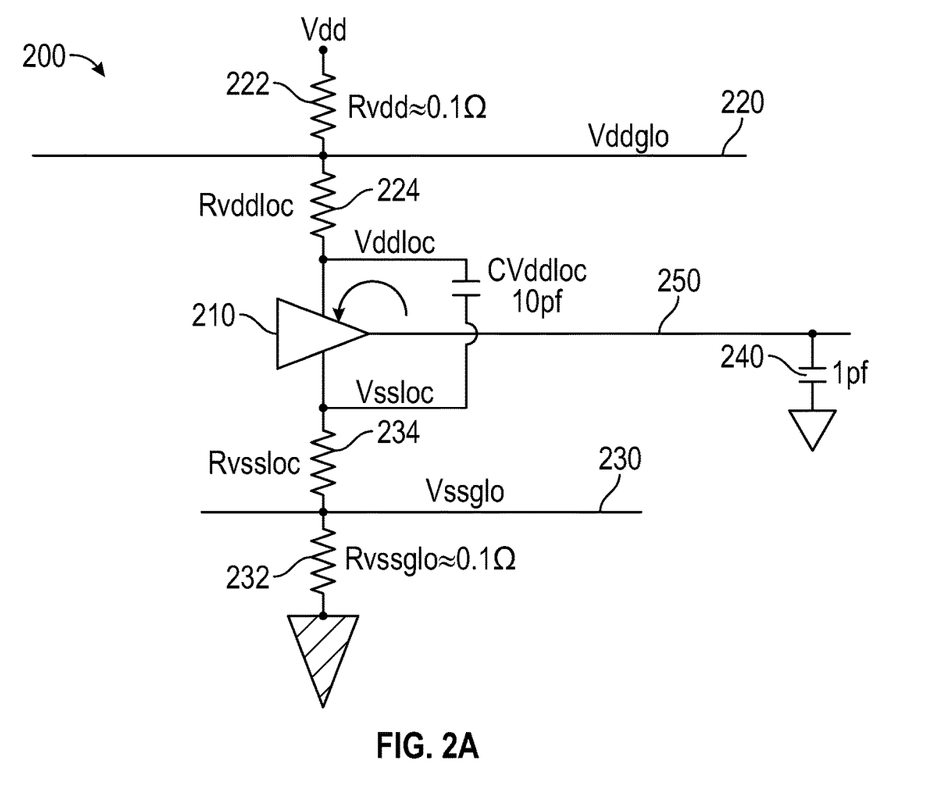
FIG. 2A shows a memory address circuit consistent with certain aspects related to the innovations herein.

FIG. 2A shows a memory address circuit 200 consistent with certain aspects related to the innovations herein. This circuit 200 is an example of a buffer circuit which may deliver a signal sent from the pre-decoder to a memory bank of the memory circuit 100. The circuit 200 may include a buffer 210 which may be connected to a global Vdd line (Vddglo) 220 and a global Vss line (Vssglo) 230 such as a global ground. As illustrated, a resistance Rvdd 222 may be present in the Vddglo line 220 between the voltage source and the buffer 210. Similarly, a resistance Rvss 232 may be present in the Vssglo line 230 between the buffer 210 and ground. In this example circuit 200, these resistances are 0.1 ohm, but this value is presented as an example only. See also the discussion of FIG. 2B below. This resistance may be 0.3 ohm in the example circuit 295 of FIG. 2B. Different memory circuits 100 may have different associated Rvss and Rvdd values. Even within a single memory circuit 100, the Rvss and Rvdd values may vary from buffer to buffer and depending on environmental factors such as temperature, for example. Returning to FIG. 2A, there may also be resistance on the local signal lines between the Vddglo 220 and Vssglo 230 lines and the buffer 210. In this circuit 200, these local resistances are labeled as Rvddloc 224 and Rvssloc 234. An output of the buffer 210 may feed a capacitive circuit 240 such as a memory bank. In this example, the capacitive circuit 240 has a capacitance of 1 pf, but other values may be possible.

This circuit 200 may also include a local voltage source (i.e., a capacitor 250) connected to the Vdd and Vss inputs of the buffer 210. In this example, a 10 pf capacitor 250 is used, although other capacitance values may be possible for the local capacitor 250. The 10 pf capacitor 250 is chosen to provide a capacitance that is ten times that of the load capacitance 240 of 1 pf, although other ratios may be employed. The local capacitor 250 may be connected to the buffer 210 Vdd and Vss inputs as close to the buffer 210 as possible in some embodiments in order to minimize line resistance between the capacitor 250 and the buffer 210.

The operation of the circuit 200 including the capacitor 250 is explained in greater detail below. The following explanation is directed to a variation of the circuit 200 which lacks the capacitor connected to the buffer. For example purposes, suppose the memory circuit 100 has a cycle time of 800 ps and that a complete memory decoding operation takes approximately one half cycle or 400 ps. The Rvdd may be 0.1 ohm in this example. The buffer operation may take roughly 40 ps in this example. If the buffer feeds a 1 pf memory bank, and there are 24 active drivers per line and four lines per memory circuit 100, a total capacitance of 24×4×1 pf or 96 pf (approximately 100 pf) may be seen by Vdd in a worst case. In this example, let Vdd be 1.2V. I=c*dv/dt, so the buffer operation may draw approximately 3 amps of instantaneous current. V=I*R, so a magnitude drop in Vdd may be 0.1*3=0.3V, or 25% of the nominal Vdd. A voltage drop of this magnitude may significantly impact memory circuit 100 performance.

Returning to the circuit 200 which includes the capacitor 250, while the buffer 210 is not conducting, the Vdd voltage may charge the capacitor 250. When the buffer 210 starts conducting in a memory decoding operation including the buffer operation, the capacitor 250 may discharge. Thus, the buffer 210 may receive a voltage not only from the global Vdd line, but also from the capacitor 250. The voltage from the capacitor 250 may be labeled as Vddloc (with the line from the capacitor 250 on the Vss side correspondingly labeled as Vssloc). As noted above, the local capacitor 250 may be connected to the buffer 210 Vdd and Vss nodes as close to the buffer 210 as possible. This may result in a minimal resistance between Vddloc/Vssloc and the buffer 210, and may at least partially isolate the buffer 210 from the Rvdd/Rvss and Rvddloc/Rvssloc during capacitor 250 discharge. After the capacitor 250 discharges and the buffer 210 stops conducting, the Vdd signal may recharge the capacitor 250. This may have the effect of spreading the voltage drop associated with the buffer operation over a longer portion of the memory cycle. Spreading the voltage drop may decrease the peak voltage drop magnitude and thereby increase memory circuit 100 performance.

Figure 2B:
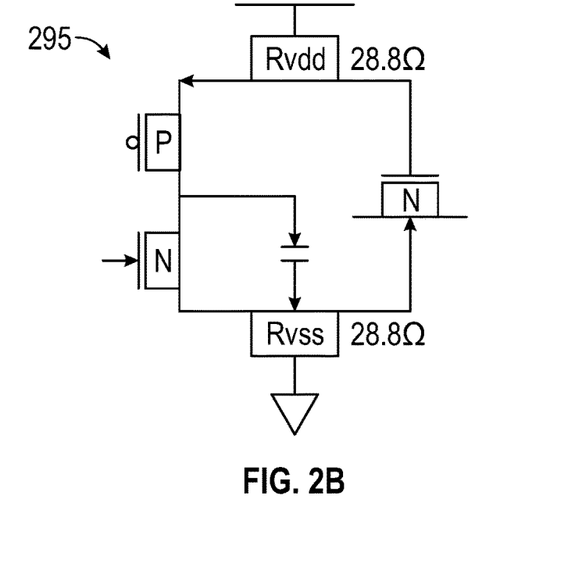
FIG. 2B shows a memory address circuit consistent with certain aspects related to the innovations herein.

FIG. 2B shows a memory address circuit 295 consistent with certain aspects related to the innovations herein. The circuit 295 of FIG. 2B is an alternate embodiment of the circuit 200 of FIG. 2A with an equivalent 28.8 ohm Rvss and Rvdd per each one of the 92 address drivers. The structure and/or operation of the circuit 295 of FIG. 2B may be otherwise similar to those of the circuit 200 of FIG. 2A.

Figure 3A:
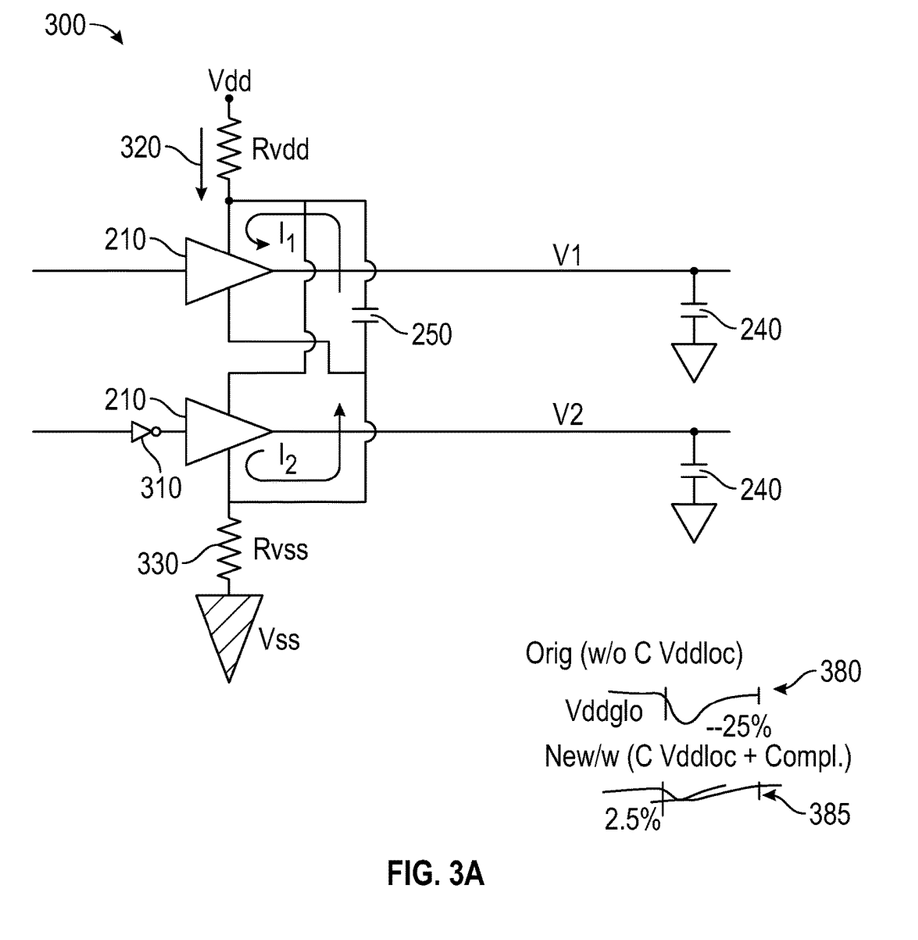
FIG. 3A shows a complimentary memory address circuit consistent with certain aspects related to the innovations herein.

FIG. 3A shows a complimentary memory address circuit 300 consistent with certain aspects related to the innovations herein. This circuit 300 is an example of a pair of buffer circuits, each of which may deliver a signal sent from the pre-decoder to a memory bank of the memory circuit 100. The circuit 300 may include a first buffer 210 which may be connected to a Vdd (for example, a Vddglo) and a Vss (for example, a Vssglo such as a global ground). The circuit 300 may also include a second buffer 210 which may also be connected to the Vdd and Vss. The data input to one of the buffers 210 (in this example the second buffer 210) may be inverted 310. Like the circuit 200 of FIG. 2A, in the circuit 300 of FIG. 3A a resistance Rvdd may be present in a Vddglo line between the voltage source and the buffer. Similarly, a resistance Rvss may be present in a Vssglo line between the buffer and ground. There may also be resistance on the local signal lines between the Vddglo and Vssglo lines and the buffer. In this circuit, these resistances are shown as a combined Rvdd 320 and Rvss 330. Each buffer output may feed a capacitive circuit 240 such as a memory bank. In this example, the capacitive circuits 240 have capacitances of 1 pf, but other values may be possible.

This circuit 300 may also include a local voltage source (i.e., a capacitor 250) connected to the Vdd and Vss nodes of each buffer 210. As illustrated, one node in the circuit 300 may link one terminal of the capacitor 250 and each buffer's Vdd input, and another node in the circuit may link the other terminal of the capacitor 250 and each buffer's Vss input. The local capacitor 250 may be connected to the buffer 210 Vdd and Vss inputs as close to the buffers 210 as possible in some embodiments in order to minimize line resistance between the capacitor 250 and the buffers 210.

As discussed above, if the capacitor 250 is not present, a memory operation wherein several drivers are simultaneously active may cause a voltage drop of enough magnitude to significantly impact memory circuit 100 performance. Adding a local capacitor 250 to an individual memory address circuit 200 with one buffer 210 may reduce the magnitude of voltage drop and thereby improve memory performance. Adding a local capacitor 250 to the complimentary memory address circuit 300 as shown in FIG. 3A may reduce the magnitude of the voltage drop even further and provide an even greater improvement in memory performance over the circuit of FIG. 2 in some embodiments.

For example, consider the circuit 300 of FIG. 3A wherein the circuit elements have the same values as in the circuit 300 of FIG. 2A (i.e., 10 pf capacitor, Rvdd of 0.1 ohm, 800 ps cycle time, 400 ps half cycle, 40 ps memory decoding operation, 100 pf max capacitance). Note that as in the case of FIGS. 2A and 2B above, other embodiments of the circuit of FIG. 3A may have different values. For example, the resistance may be 0.3 ohm in the example circuit 395 of FIG. 3B. While each buffer 210 is not conducting, the Vdd voltage may charge the capacitor 250. When one or both of the buffers 210 starts conducting in a memory decoding operation including the buffer operation, the capacitor 250 may discharge. In a situation wherein only one of the pair of buffers 210 starts conducting, the circuit 300 of FIG. 3A may behave similarly to the circuit 200 of FIG. 2A. However, when both buffers 210 are simultaneously conducting, current may flow from one terminal of the capacitor 250 into the first, non-inverted buffer 210, and current may also flow from the second, inverted buffer 210 into the other terminal of the capacitor 250. This may cause the capacitor 250 in the circuit 300 of FIG. 3A to discharge more slowly than the capacitor 250 in the circuit 200 of FIG. 2A. Thus, the first buffer 210 may receive a voltage not only from the global Vdd line, but also from the capacitor 250. The inverted signal of the second buffer 210 may supply a voltage to the capacitor 250 at the same time, rather than merely draining to Vss. The voltage from the capacitor 250 may be labeled as Vddloc, and the voltage into the capacitor 250 may be correspondingly labeled as Vssloc. As noted above, the local capacitor 250 may be connected to the Vdd and Vss nodes of the buffers 210 as close to the buffers 210 as possible. This may result in a minimal resistance between Vddloc/Vssloc and the buffers 210, and may at least partially isolate the buffers 210 from the Rvdd/Rvss and Rvddloc/Rvssloc during capacitor 250 discharge. After the capacitor 250 discharges and the buffers 210 stop conducting, the Vdd signal may recharge the capacitor 250. This may have the effect of spreading the voltage drop associated with the buffer operations over a longer portion of the memory cycle. Spreading the voltage drop may decrease the peak voltage drop magnitude and thereby increase memory circuit 100 performance. For example, the buffer operation may draw approximately 0.3 amps of instantaneous current. Therefore, instead of a magnitude drop in Vdd of 0.1*3=0.3V, or 25% of the nominal Vdd (see curve 380), the circuit 300 of FIG. 3A may provide a magnitude drop in Vdd of 0.1*0.3=0.03V, or 2.5% of the nominal Vdd (see curve 385). Because the capacitor 250 of the circuit 300 of FIG. 3A may drain more slowly than in the circuit 200 of FIG. 2A, the peak voltage drop magnitude may be reduced even more by the circuit 300 of FIG. 3A, as discussed in greater detail below with respect to FIG. 4.

Figure 3B:
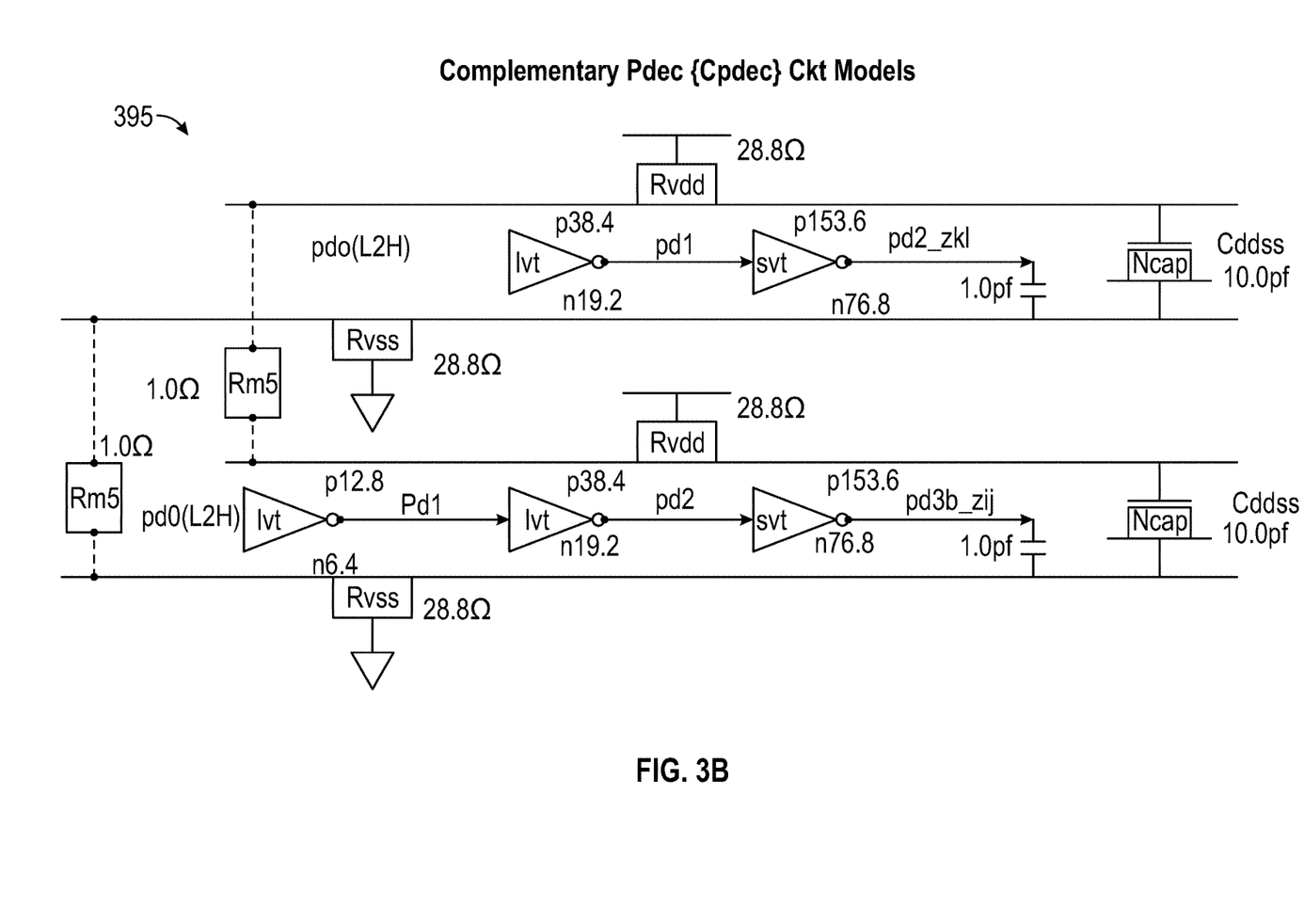
FIG. 3B shows a complimentary memory address circuit consistent with certain aspects related to the innovations herein.

FIG. 3B shows a memory address circuit 395 consistent with certain aspects related to the innovations herein. The circuit 395 of FIG. 3B is an alternate embodiment of the circuit 300 of FIG. 3A, but with an equivalent 28.8 ohm Rvss and Rvdd per each one of the 92 address drivers. The structure and/or operation of the circuit 395 of FIG. 3B may be otherwise similar to those of the circuit 300 of FIG. 3A.

Figure 4:
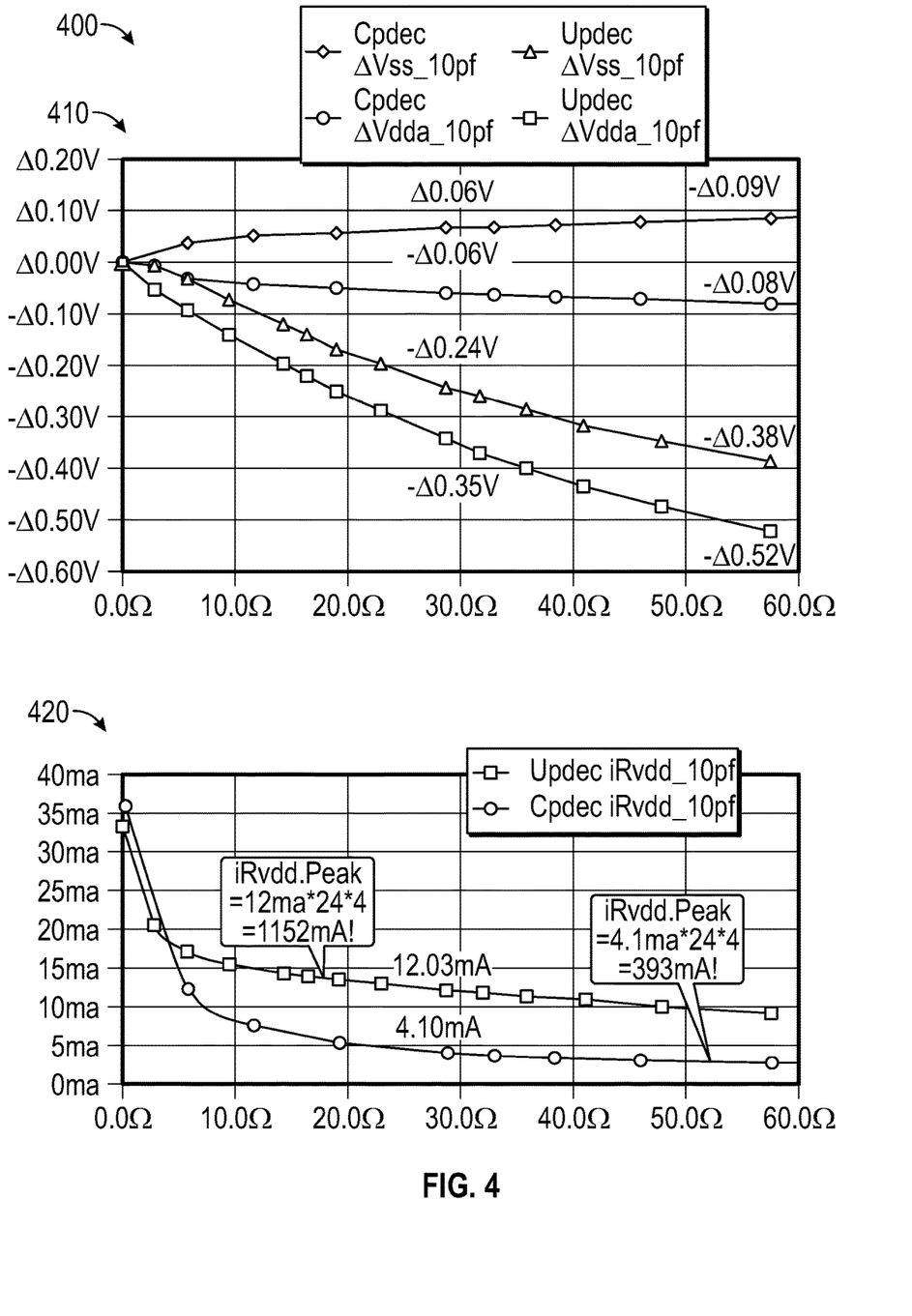
FIG. 4 shows a memory address circuit comparison consistent with certain aspects related to the innovations herein.

FIG. 4 shows a memory address circuit comparison 400 consistent with certain aspects related to the innovations herein. In the left graph 410, changes in Vss and Vdd for an embodiment similar to those of FIGS. 2A and 2B are plotted against Rvdd values and labeled as "updec ΔVss_10 pf" and "updec ΔVdda_10 pf", respectively. Also in the left graph 410, changes in Vss and Vdd for an embodiment similar to those of FIGS. 3A and 3B are plotted against Rvdd values and labeled as "cpdec ΔVss_10 pf" and "cpdec ΔVdda_10 pf", respectively. As illustrated in the left graph 410, voltage drops for the complimentary circuits may be significantly lower in magnitude than those for the single buffer circuits. However, each of these drops may be lower in magnitude than those for a circuit lacking a local capacitor.

In the right graph 420, changes in Ivdd for an embodiment similar to those of FIGS. 2A and 2B are plotted against Rvdd values and labeled as "updec iRvdd_10 pf". Also in the right graph 420, changes in Ivdd for an embodiment similar to those of FIGS. 3A and 3B are plotted against Rvdd values and labeled as "cpdec iRvdd_10 pf". As illustrated in the right graph 420, current peaks for the complimentary circuits may be significantly lower in magnitude than those for the single buffer circuits. However, each of these peaks may be lower in magnitude than those for a circuit lacking a local capacitor.

In addition to the above memory architecture and methods, the present inventions also include, inter alia, methods of fabricating memory devices consistent with the features and/or functionality herein, products (such as memory circuits or products embodying memory circuits), and products produced via such processes. By way of example and not limitation, methods of such fabrication may include known memory manufacturing processes in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001,674, 6,117,754, 6,127,706, 6,417,549, 6,894,356, and 7,910,427 as well as U.S. patent application publication No. US2007/0287239A1, which are incorporated herein by reference.

As disclosed herein, features consistent with the present inventions may be utilized via and/or involved with computer hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of them. Further, while some of the disclosed implementations describe specific hardware components, systems and methods consistent with the innovations herein may be implemented in the context of any combination of hardware, software and/or firmware. Moreover, the above-noted features and other aspects and principles of the innovations herein may be implemented in various memory environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media), though does not include transitory media such as carrier waves.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. A memory circuit comprising:
   a plurality of memory banks;
   a pre-decoder configured to receive data from and send data to circuitry external to the memory circuit;
   a data line coupled to the pre-decoder; and
   a plurality of memory address circuits, each of the memory address circuits being coupled to the data line and to at least one of the memory banks; each memory address circuit comprising:
      a first buffer comprising a power input and a ground input;
      a capacitor comprising a first terminal connected to the power input of the first buffer and a second terminal connected to the ground input of the first buffer so that when the first buffer draws a current from the power input, at least a portion of the current is supplied by the capacitor;
      a second buffer comprising a power input, a ground input, and a line input; and
      an inverter connected to the line input of the second buffer; wherein
      the first terminal of the capacitor is also connected to the power input of the second buffer and the second terminal of the capacitor is also connected to the ground input of the second buffer so that when the second buffer draws a current from the power input, a current is supplied from the ground input of the second buffer to the capacitor.

2. The memory circuit of claim 1, wherein, in each memory address circuit:
   the first terminal of the capacitor is connected to the power input of the first buffer such that a line distance between the first terminal of the capacitor and the power input of the first buffer is minimized; and
   the second terminal of the capacitor is connected to the ground input of the first buffer such that a line distance between the second terminal of the capacitor and the ground input of the first buffer is minimized.

3. The memory circuit of claim 1, wherein, in each memory address circuit:
   the first terminal of the capacitor is connected to the power input of the second buffer such that a line distance between the first terminal of the capacitor and the power input of the second buffer is minimized; and
   the second terminal of the capacitor is connected to the ground input of the second buffer such that a line distance between the second terminal of the capacitor and the ground input of the second buffer is minimized.

4. The memory circuit of claim 1, wherein, in each memory address circuit:
   the first buffer comprises a line input coupled to the data line;
   the inverter comprises a line input coupled to the data line;
   the first buffer is configured to draw the current from the power input of the first buffer when a data signal is present on the line input of the first buffer; and
   the second buffer is configured to draw the current from the power input of the second buffer when a data signal is present on the line input of the inverter.

5. The memory circuit of claim 1, wherein, in each memory address circuit:
   the first buffer comprises a line output coupled to one of the memory banks:
   the second buffer comprises a line output coupled to one of the memory banks;
   the first buffer is configured to draw the current from the power input of the first buffer in response to a command to access the storage element connected to the line output of the first buffer; and
   the second buffer is configured to draw the current from the power input of the second buffer in response to a command to access the storage element connected to the line output of the second buffer.

6. The memory circuit of claim 1, further comprising:
   a global power line connected to the power input of the first buffer of each memory address circuit, the power input of the second buffer of each memory circuit, or a combination thereof, the global power line comprising a resistance; and
   a global ground line connected to the ground input of the first buffer of each memory address circuit, the ground input of the second buffer of each memory address circuit, or a combination thereof, the global ground line comprising a resistance.

7. The memory circuit of claim 1, wherein the memory circuit is configured to reduce a change in voltage in an associated memory circuit, when, in each memory address circuit, the first buffer draws the current from the power input of the first buffer, when the second buffer draws the current from the power input of the second buffer, or in either case, compared to a circuit comprising the first buffer, the second buffer, or a combination thereof and not comprising the capacitor connected to the first buffer, the second buffer, or the combination thereof.

8. The memory circuit of claim 1, wherein the memory circuit is configured to increase an operation speed in an associated memory circuit, when, in each memory address circuit, the first buffer draws the current from the power input of the first buffer, when the second buffer draws the current from the power input of the second buffer, or in either case, compared to a circuit comprising the first buffer, the second buffer, or a combination thereof and not comprising the capacitor connected to the first buffer, the second buffer, or the combination thereof.

9. The memory circuit of claim 1, further comprising a repeater coupled to the data line and configured to boost a signal on the data line.

10. A memory circuit comprising:
a plurality of memory banks;
a data line; and
a plurality of memory address circuits, each of the memory address circuits being coupled to the data line and to at least one of the memory banks; each memory address circuit comprising:
a first buffer configured to deliver a first data signal to the at least one of the memory banks;
a capacitor coupled to the first buffer so that when the first buffer draws a current from a power source, at least a portion of the current is supplied by the capacitor; and
a second buffer configured to deliver a second data signal to the memory circuit; wherein
the capacitor is also coupled to the second buffer so that when the second buffer draws a current from the power source, a current is supplied from the second buffer to the capacitor.

11. The memory circuit of claim 10, wherein, in each memory address circuit:
the capacitor is coupled to the first buffer via two capacitor terminals; and
the capacitor is coupled to the first buffer such that line distances between each of the two capacitor terminals and the first buffer are minimized.

12. The memory circuit of claim 10, wherein, in each memory address circuit:
the capacitor is coupled to the second buffer via two capacitor terminals; and
the capacitor is coupled to the second buffer such that line distances between each of the two capacitor terminals and the second buffer are minimized.

13. The memory circuit of claim 10, wherein, in each memory address circuit:
the first buffer receives the first data signal via a first line input; and
the first buffer is configured to draw the current from the power source when the first data signal is present on the first line input.

14. The memory circuit of claim 10, wherein, in each memory address circuit:
the second buffer receives the second data signal via an inverter coupled to a second line input; and
the second buffer is configured to draw the current from the power source when the second data signal is present on the second line input.

15. The memory circuit of claim 10, wherein, in each memory address circuit:
the first buffer comprises a line output coupled to one of the memory banks:
the second buffer comprises a line output coupled to one of the memory banks;
the first buffer is configured to draw the current from the power source in response to a command to access the storage element connected to the line output of the first buffer; and
the second buffer is configured to draw the current from the power source in response to a command to access the storage element connected to the line output of the second buffer.

16. The memory circuit of claim 10, wherein the power source comprises:
a global power line coupled to the first buffer of each memory address circuit and the second buffer of each memory address circuit, the global power line comprising a resistance; and
a global ground line coupled to the first buffer of each memory address circuit and the second buffer of each memory address circuit, the global ground line comprising a resistance.

17. The memory circuit of claim 10, wherein the memory circuit is configured to reduce a change in voltage in an associated memory circuit, when, in each memory address circuit, the first buffer draws the current from the power source, when the second buffer draws the current from the power source, or in either case, compared to a circuit comprising the first buffer, the second buffer, or a combination thereof and not comprising the capacitor connected to the first buffer, the second buffer, or the combination thereof.

18. The memory circuit of claim 10, wherein the memory circuit is configured to increase an operation speed in an associated memory circuit, when, in each memory address circuit, the first buffer draws the current from the power source, when the second buffer draws the current from the power source, or in either case, compared to a circuit comprising the first buffer, the second buffer, or a combination thereof and not comprising the capacitor connected to the first buffer, the second buffer, or the combination thereof.

19. The memory circuit of claim 10, further comprising a pre-decoder coupled to the data line and configured to receive data from and send data to circuitry external to the memory circuit.

20. The memory circuit of claim 10, further comprising a repeater coupled to the data line and configured to boost a signal on the data line.

21. A method of operating a circuit comprising:
receiving a first data signal at a line input of a first buffer of a memory address circuit;
drawing a current, with the first buffer, when the data signal is received at the line input;
receiving a second data signal at a line input of a second buffer of a memory address circuit; and
drawing a current, with the second buffer, when the data signal is received at the line input;
wherein at least a portion of the current drawn by the first buffer is supplied by a capacitor coupled to the first buffer; and
wherein at least a portion of the current drawn by the second buffer is supplied by the capacitor coupled to the first buffer and the second buffer.

22. The method of claim 21, further comprising sending, with the first buffer, the first data signal to a storage element.

23. The method of claim 21, further comprising sending, with the second buffer, the second data signal to a storage element.

24. The method of claim 21, further comprising inverting the second data signal before it is received at the line input of the second buffer.

25. The method of claim 21, wherein the method reduces a change in voltage in an associated memory circuit compared to a method wherein at least a portion of the current drawn by the first buffer, at least a portion of the current drawn by the second buffer, or a combination thereof is not supplied by the capacitor.

26. The method of claim 21, wherein the method increases an operation speed in an associated memory circuit compared to a method wherein at least a portion of the current drawn by the first buffer, at least a portion of the current drawn by the second buffer, or a combination thereof is not supplied by the capacitor.

27. The method of claim 21, wherein the method is used to access a memory device.

\* \* \* \* \*